United States Patent [19]

Kumar et al.

[11] Patent Number: 5,793,253
[45] Date of Patent: Aug. 11, 1998

[54] HIGH POWER SOLID STATE MICROWAVE TRANSMITTER

[75] Inventors: Mahesh Kumar, Hauppauge; Michael Hanczor, Commack, both of N.Y.

[73] Assignee: Unisys Corporation, Blue Bell, Pa.

[21] Appl. No.: 430,988

[22] Filed: Apr. 28, 1995

[51] Int. Cl.[6] .......................................... H03F 3/68
[52] U.S. Cl. .................. 330/124 R; 330/51; 330/124 D; 330/149; 330/295
[58] Field of Search ................... 330/51, 124 R, 330/124 D, 149, 295

[56] References Cited

U.S. PATENT DOCUMENTS

| | | | |
|---|---|---|---|
| 4,068,186 | 1/1978 | Sato et al. | 330/149 |
| 4,122,399 | 10/1978 | Heiter et al. | 330/149 |
| 5,119,042 | 6/1992 | Crampton et al. | 330/245 |
| 5,218,322 | 6/1993 | Allison et al. | 330/295 X |
| 5,287,543 | 2/1994 | Wolkstein | 330/124 R |

FOREIGN PATENT DOCUMENTS

| | | | |
|---|---|---|---|
| 242403 | 10/1987 | Japan | 330/149 |
| 5-315848 | 1/1993 | Japan | 330/149 |
| 9119349 | 12/1991 | WIPO | 330/124 D |

OTHER PUBLICATIONS

Skolnik, "Radar Handbook 2nd. Edition", Chapter 5, McGraw-Hill Book Company, New York, 1990.
Rivera, "An S-Band Solid-State Transmitter for Airport Surveillance Radars", Record of the IEEE National Radar Conference, 1993.

Primary Examiner—James B. Mullins
Attorney, Agent, or Firm—Seymour Levine; Stanton D. Weinstein; Mark T. Starr

[57] ABSTRACT

A power amplifier includes a plurality of signal amplifying stages. An amplitude compensator positioned prior to the ultimate signal amplifying stage equalizes the signal amplitudes in the frequency band of interest to provide a substantially flat frequency response. Fail-soft operation is established by providing switchably redundant amplifiers. When an operating amplifier is detected as failing, automatic switching is performed to replace the failing unit with an identical unit to maintain amplifier operation. High-power amplification is accomplished by splitting a preamplified signal into a plurality of signals, amplifying the lower level signals so obtained, and then recombining the amplified signals.

10 Claims, 4 Drawing Sheets

HIGH POWER SOLID STATE MICROWAVE TRANSMITTER

BACKGROUND OF THE INVENTION

1. Field of the Invention

The invention pertains to the field of microwave transmitters and more particularly to high power microwave transmitters employing amplifiers.

2. Description Of The Prior Art

Sub-clutter visibility, moving target indication (MTI), resolution, and range requirements of modern radar systems require high power transmitters having good pulse-to-pulse frequency and amplitude stability. These systems must also have high reliability, exhibiting a mean time between failures that is extremely high. Such requirements generally lead to the selection of an amplifier type transmitter over an oscillator type.

Oscillator type transmitters, such as magnetrons and klystron oscillators, do not possess the frequency and amplitude stability and reliability required in modern radar systems.

Klystron amplifiers do not possess the instantaneous bandwidth and reliability required for modern radar. Further, these tubes may provide phase variations between input pulses that limit sub-clutter visibility and MTI performance of a radar system. Additionally, klystrons are costly, difficult to maintain, and require high voltage power supplies which are difficult to regulate.

Traveling Wave Tubes (TWT), while providing an appreciable bandwidth increase relative to that of the klystrons are severely power limited, exhibiting power limitations far below the power limitations of the klystron. Though octave bandwidths may be achieved, the power output of these devices is limited to a few kilowatts. At higher power levels these amplifiers tend to oscillate at the band edges. Increased power output for TWTs may be achieved with the utilization of coupled cavity circuits. This construction, however, creates a TWT which, when subjected to pulse modulation, tends to oscillate during the rise and fall times of the pulse. Additionally, TWTs exhibit poor pulse-to-pulse phase stability. The pulse-to-pulse stability of a TWT is a function of the beam voltage stability and the TWT phase pushing factor. Since this beam voltage is a high voltage, its regulation to the few milli volts required to achieve the necessary pulse-to-pulse stability is extremely difficult.

Highly reliable and frequency stable solid state oscillators have been utilized as transmitters in modern systems. These oscillators, however, are so limited in power as to require pulse compression techniques to achieve desired range and range resolution performance. This solution adds appreciable complication to the system and requires a significant increase in system bandwidth, which is obtained only at considerable expense.

It is therefore desirable to provide a transmitter that has high power capability, is frequency stable, and is capable of operating over a relatively wide frequency band.

SUMMARY OF THE INVENTION

A solid state transmitter in accordance with the present invention receives signals from a low power output oscillator and provides two stages of amplification, each stage designed to have extremely low phase pushing factors so that excellent pulse-to-pulse phase stability is achieved. The first stage comprises a driver amplifier having an output signal which varies with frequency in the frequency band, the signals at the low requency end of the frequency having amplitudes that are higher than the amplitudes of the signals at the high end of the band. The driver amplifier is coupled, Via an amplitude compensator, to the second stage wherein it is divided into a multiplicity of signals by a radial signal divider network. The amplitude compensator is constructed to over compensate for the lower amplitude signals at the high end of the frequency band, e.g. amplitude levels of the signals at high end of the frequency band, at the output terminal of the amplitude compensator, have amplitude levels that are higher than the amplitude levels of the signals at the low end of the frequency band.

The multiplicity of signals from the divider network are respectively coupled to a multiplicity of high power amplifiers. These high power amplifiers have frequencies responses similar to the frequency response of the driver amplifier, the signals at the low frequency end of the band having amplitudes that are greater than the amplitudes of the signals at the high frequency end of the band. Consequently, the amplitude over compensation provided by the amplitude compensator causes the frequency response at the output of the high power amplifiers to be flat across the band. Output signals of the high power amplifiers are coupled to a radial combiner network, wherein the signals are combined to provide one (1) amplified output signal.

Each of the multiplicity of high power amplifiers is a module of the second stage output amplifier. This arrangement provides fail-soft performance, in that the failure of one or more of the multiplicity of amplifiers does not cause a catastrophic failure. Additionally, transmitter operation need not be interrupted when a module fails, replacement may be performed during transmitter operation.

The invention will now be more fully described in its broader aspects with reference to the accompanying drawings.

DESCRIPTION OF THE PREFERRED EMBODIMENTS

Figure 1:
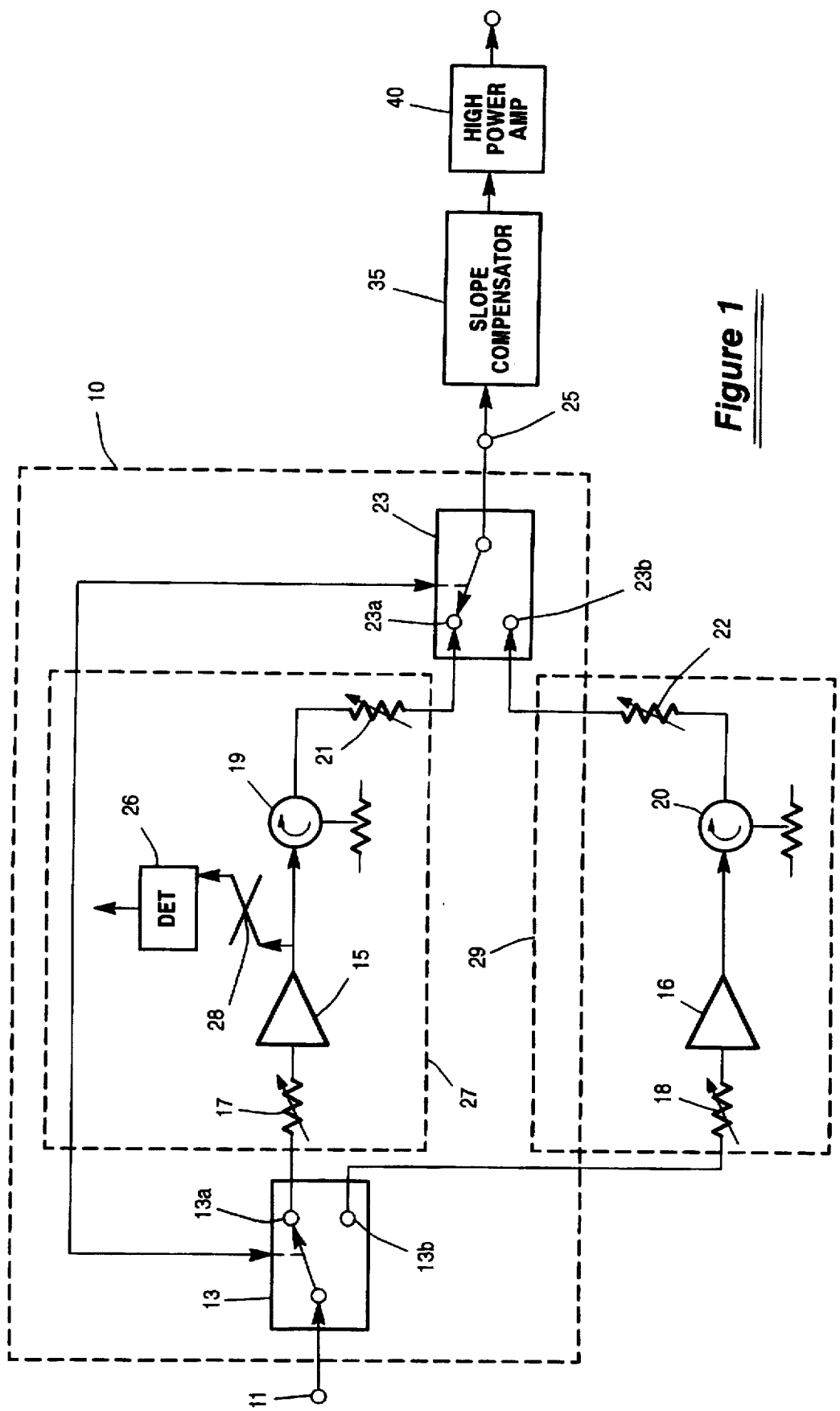
FIG. 1 is a block diagram of a preferred embodiment of the invention.

Refer now to FIG. 1. A signal at the input terminal 11 of the first stage 10 of a two stage amplifier is coupled to a single pole double throw (SPDT) switch 13, having terminals 13a and 13b. The first stage 10 includes a first amplifier 15, coupled to switch terminal 13a, and a second amplifier 16, coupled to switch terminal 13b. The switch 13 is positioned to couple the signal at the input terminal 11 to one of the two amplifiers 15 or 16. Switching between the amplifiers will be more fully discussed subsequently. Variable attenuators 17 and 18 are respectively coupled between the amplifiers 15 and 16 and the switch 13. These variable attenuators are adjusted to compensate for variations in the gain of the amplifiers 15 and 16 and attenuation variations in the amplifier circuits to establish equal overall gains for the two amplifiers. To minimize load reflections to the amplifier, the output terminals of the amplifiers 15 and 16 are respectively coupled to circulators 19 and 20, which in turn are coupled to variable attenuators 21 and 22, which are utilized to adjust the output power level of the amplifiers.

Switch 23 is positioned, along with switch 13, to select one of the two amplifiers 15 and 16 for amplifying the signal at the input terminal 11 of the first stage 10 and providing the amplified signal at the output terminal of the first stage. The circuit chains, 15,19,21 and 16,20,22 are identical and are constructed as unit modules 27 and 29, respectively. Module 27 may be the default module. Should this module fail, signal detector 26, which is coupled to receive a portion of the amplifier 15 output signal via directional coupler 28, provides a failure signal to switches 13 and 23 that alters the positions of switches 13 and 23 to couple the module 29 between the input terminal 11 and the output terminal 25 so that the operation of the two stage amplifier may continue without interruption while the failed module is replaced.

The amplifiers 15 and 16, as are all other amplifiers to be discussed herein, are designed to provide a phase pushing factor, defined as $\Delta\phi/\Delta V_{cc}$, that is less than 5.0°/volt (0.087 rad/volt) and a voltage output $V_O$ pushing factor, defined as $\Delta V_O/\Delta V_{cc}$, that is less than 0.5 dB/volt ($\Delta V_O/\Delta V_{cc}$<1.06). The $V_{cc}$ power supply, not shown, is regulated to provide a pulse-to-pulse ripple that is less than three (3) millivolts. This ripple factor and the low phase and voltage pushing factors combine to provide a subclutter visibility for the two stage amplifier that is in the order of −75 dB.

Figure 2:
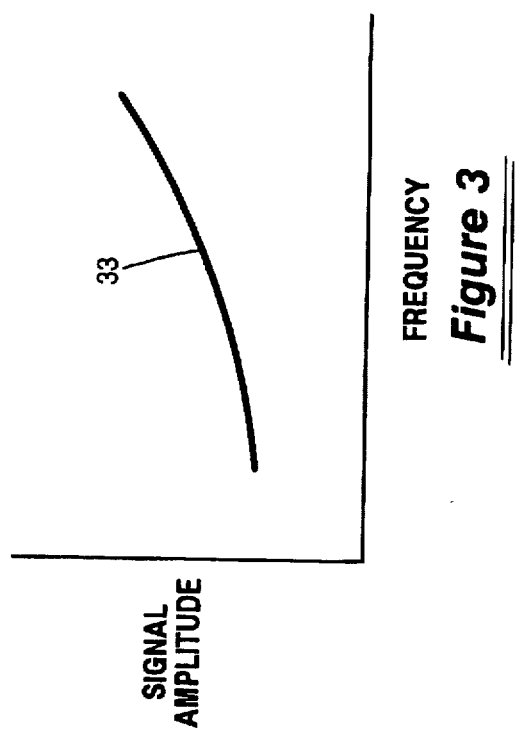
FIG. 2 is a graph representative of the signal response of an amplifier.
Figure 3:
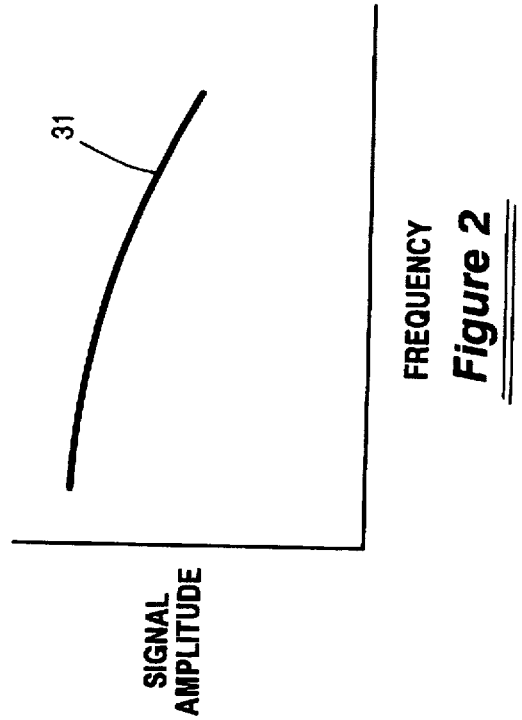
FIG. 3 is a graph representative of a signal response required of a circuit coupled to an amplifier, having the signal response shown in FIG. 2, to establish a constant signal level output over the frequency band of the amplifier.

Output terminal 25 of the switch 23 is coupled to a high power amplifier 40 via a slope compensator 35. It is desirable for the amplitude of the signal at the output terminal of the high power amplifier 40 to be at the same level for all frequencies within the amplifier bandwidth. The frequency response of the modules 27 and 29, however, decrease monotonically with frequency, as does the frequency response of the amplifiers in the high power amplifier. A typical response is shown by curve 31 in FIG. 2. To compensate for the decrease in signal amplitude with increasing frequency and provide a substantially level signal amplitude versus frequency at the output terminal of the high power amplifier 40, a signal amplitude-frequency slope compensator 35, which has a monotonically increasing signal versus frequency response as shown by the curve 33 in FIG. 3, is coupled to the output terminal 25 of the first stage 10 of the amplifier. The frequency response of the slope compensator is such as to provide a signal level vs. frequency response, at the output terminal of the slope compesator, such that the signal levels at the higher frequencies are greater than the signal levels at the lower frequencies.

Figure 4:
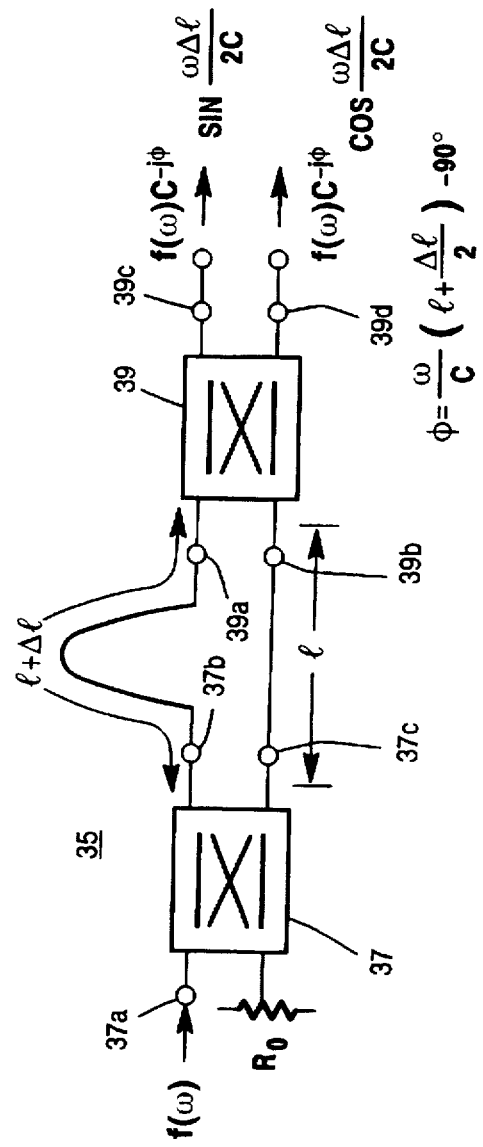
FIG. 4 is a block diagram of a circuit which may provide the frequency response shown in FIG. 3.

The slope compensator may be of the type shown in FIG. 4. A signal is coupled to an input terminal 37a of a first quadrature hybrid 37, while the second input terminal is terminated with a matched load $R_O$. The input signal is divided in a manner that couples a signal 3 dB down from and in-phase with the input signal to a first output terminal 37b and a signal 3 dB down from and in quadrature with the input signal to a second output terminal 37c. The in-phase signal at terminal 37b is coupled to an input terminal 39a of a second quadrature hybrid via a transmission line of length l+Δl, while the quadrature signal at terminal 37c is coupled to a second input terminal 39b of the second quadrature hybrid 39 via a transmission line of length l. The signal at terminal 39a divides in a manner that couples a signal 3 dB down from and in-phase with the signal at terminal 39a to terminal 39c and a signal 3 dB down from and in quadrature with the signal at terminal 39a to terminal 39d. Similarly, the signal at terminal 39b divides in a manner that couples a signal 3 dB down from and in-phase with the signal at terminal 39b to terminal 39d and a signal 3 dB down from and in quadrature with the signal at terminal 39b to terminal 39c.

Since the length of the transmission line between terminal 37b and terminal 39a is longer than the transmission line between terminals 37c and 39b by Δl, the signals coupled to terminal 39a lag the signals coupled to terminal 39b by a phase angle that is equal to (ωΔl)/(2c), where ω is the radian frequency of the signal and c is the signal phase velocity in the transmission lines between the two hybrids. It should now be apparent that the signal $S_c$ at the output terminal 39c and the signal $S_d$ at the output terminal 39d are:

$$S_c = f(\omega) \, \epsilon^{-j\Phi} \sin \frac{\omega \Delta l}{2c}$$

$$S_d = f(\omega) \, \epsilon^{-j\Phi} \cos \frac{\omega \Delta l}{2c}$$

where:

$$\Phi = \frac{\omega}{c} \left( 1 + \frac{\Delta l}{2} \right) - 90°$$

Either of the two signals at the output terminals of hybrid 39 may be chosen to provide the slope compensation. The selection of Δl is made to provide the portion of the sine or cosine curve, depending on which of the output signals is chosen, that best matches the desired compensation frequency response. Though the slope compensator just described can compensate for the frequency response curve of the amplifier, perfect compensation may not be achievable in all cases. It should be recognized that other types of slope compensators may be utilized. One such compensator is the leading edge of a filter frequency response which may be tailored to provide the desired monotonic amplitude increase with frequency.

Figure 5:
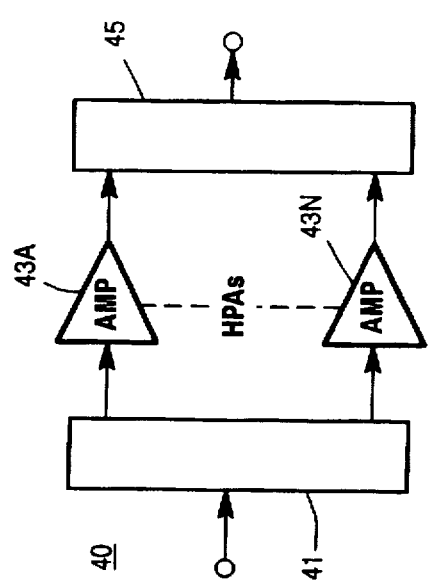
FIG. 5 is a block diagram of a high power amplifier which may be utilized in the embodiment shown in FIG. 1.

Referring again to FIG. 1. The signal at the output terminal of the slope compensator 35 is coupled to a high power amplifier for further amplification. This amplifier includes a 1 to N power divider 41, N amplifiers 43A–43N having input terminals respectively coupled to the power divider 43 output terminals, and a N to 1 power combiner 45, as shown in FIG. 5. The output signal of the slope compensator, which may be in the order of 250 Watts, is divided into N equal power signals, where N may be 50, by the power divider 41. These N signals, each of which may be in the order of 5 Watts, are respectively coupled to the N amplifiers, each of which may have a gain of 20 dB, thus providing a power output from each amplifier of 500 Watts. The 500 Watts signals at the output terminals of the amplifiers 43A–43N are respectively coupled to the input terminals of the combiner 45 and combined to provide a signal in the order of 25 kW at the output terminal 45a of the signal combiner 45.

Figure 6A:
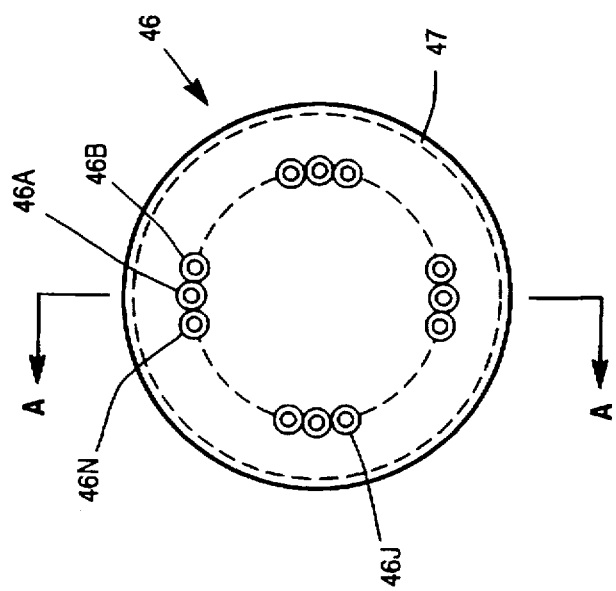
FIGS. 6A and 6B are plane and cross-sectional views of a power divider/combiner which may be utilized for the power divider and power combiner of FIG. 5.
Figure 6B:
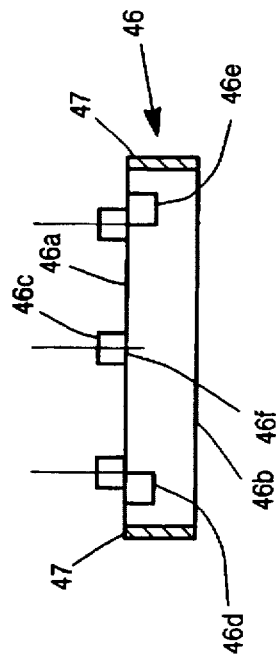

The power divider 41 and the power combiner 45 are reciprocal devices, therefore the divider and combiner may be the same devices. Referring to FIGS. 6A and 6B, wherein a plan view 46A and a cross sectional view 46B of a device 46 which may be utilized as a power divider/combiner are shown; power divider 43 and power combiner 45 may be constructed of two parallel radial plates 46a and 46b arranged to form a reactive, air-dielectric, non-resonant radial transmission line operating in the $TM_{00}$ mode. The N terminals 46A–46N are equally spaced radially on one plate of the two parallel plates. A terminal 46c, at which the signal to be divided or the signal to be combined is coupled, may be centrally positioned on either of the two parallel plates. For convenience of access to all terminals from a single side of the divider/combiner it is preferable to include the central terminal 46c on the same plate as the N radial terminals. The equally spaced radial terminals are coupled to the radial transmission line by shorted coaxial probes, as shown at 46d and 46e. Central terminal 46c is coupled to the radial transmission line by a non-shorted coaxial probe 46f to provide omni-directional coupling to the radial transmission line and uniform coupling to the terminals 46A–46N. Leakage from the non-resonant structure is minimized by a circumferential matched load 47 at the perimeter of the radial structure.

A divider/combiner of the type just described may provide an insertion loss that is less than 0.25 dB, minimum isolation between terminals of 11 dB, coupling variations between terminals of ±0.25 dB, phase variations between terminals of ±3°, and a voltage standing wave ratio (VSWR) that is less than 1.25:1.

Figure 7:
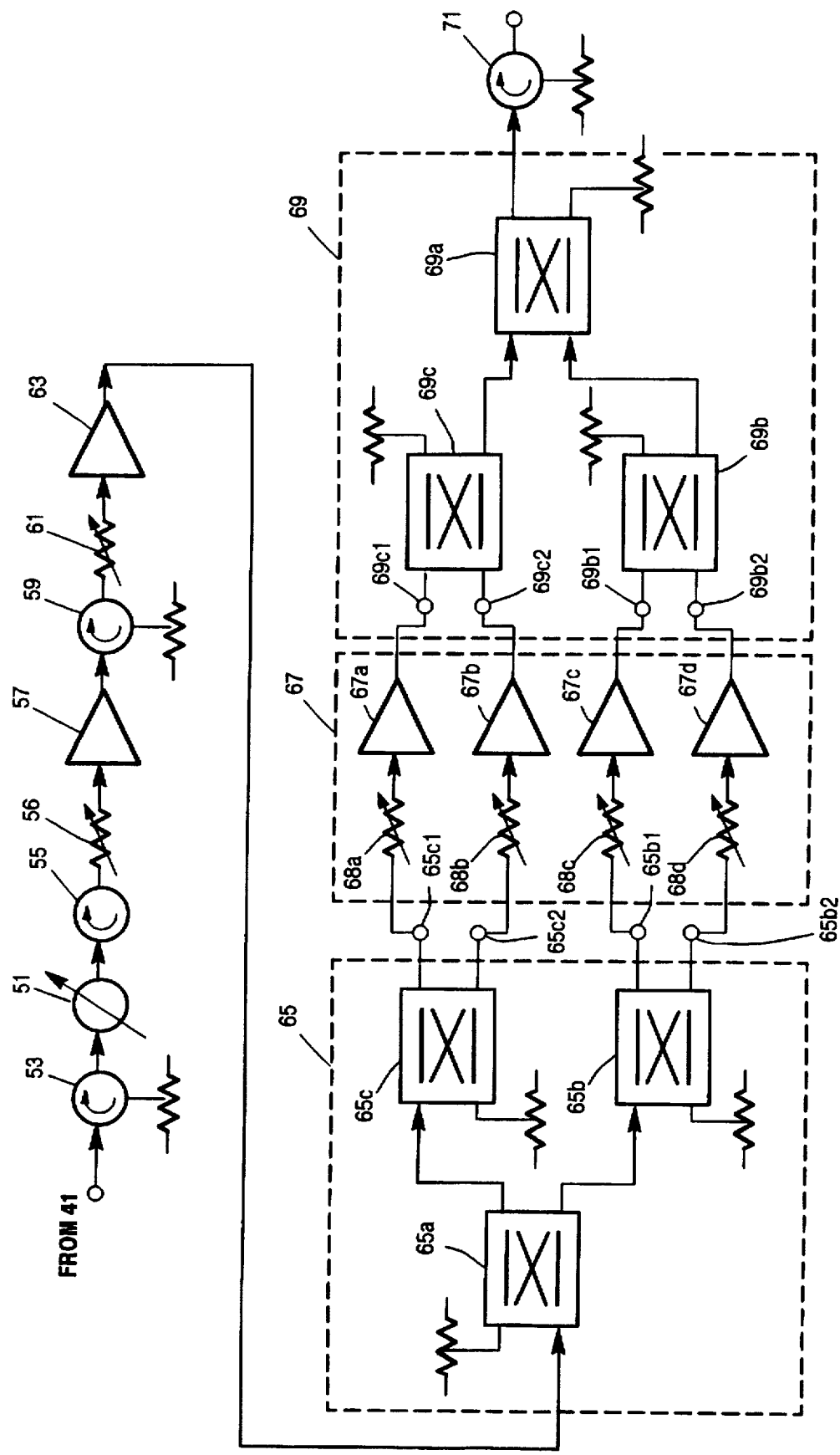
FIG. 7 is a block diagram of an amplifier which may be used as an amplifier module in the high power amplifier of FIG. 5.

Refer now to FIG. 7, wherein a block diagram of an amplifier 50 that may be utilized as the amplifiers 43A–43N is shown. To achieve the desired power output for the amplifiers 43A–43N with moderately sized high power amplifiers, the signal amplification in the amplifier 50 is performed in three stages. Signals from the power divider 41 are coupled to a variable phase shifter 51 via a circulator 53. The phase shifter 51 is adjusted at each of the N amplifiers to establish an overall phase angle which is equal to the signal phase angle of each of the other amplifiers. Signals at the output terminals of the phase shifter 51 are coupler via a circulator 55 and variable attenuator 56 to the first stage amplifier 57. Variable attenuator 56 is adjusted to control saturation of the first stage amplifier 57. A circulator 59 is coupled between the output terminal of the amplifier 57 and a variable attenuator 61 which is adjusted to provide signals from the first stage amplification to a second stage amplifier 63 that are at a preselected level. The power level at the output terminal of amplifier 63 is not as yet at the desired input level for the amplifiers 43A–43N and requires additional amplification.

In order to provide the additional amplification the signal at the output terminal of the amplifier 63 is coupled to a 1 to 4 power divider 65. This power divider includes three (3) quadrature hybrids 65a, 65b, and 65c. One input terminal of hybrid 65a is coupled to receive the output signal from amplifier 63 and the other input terminal is terminated in a matched load. The output signal from hybrid 65a which is in-phase with the input signal is coupled to one input port of hybrid 65b, the other input port is terminated with a matched load. The output signal from hybrid 65a which is in-quadrature with the input signal is coupled to one input terminal of hybrid 65c, the other input terminal is terminated with a matched load. The hybrid arrangement shown in FIG. 7, provides signals at the output terminals 65b1, 65b2, 65c1, and 65c2 which are $\frac{1}{2}S_{in}$, $\frac{1}{2}S_{in}e^{j90}$, $\frac{1}{2}S_{in}e^{j90}$, and $\frac{1}{2}S_{in}e^{j180}$, respectively. Where $S_{in}$ is the signal level of the signal coupled from amplifier 63. These four signals are respectively coupled to high power amplifiers 67a, 67b, 67c, and 67d, which have equal amplification. Variable attenuators 68a, 68b, 68c, and 68d, may be coupled, respectively, between amplifier 63 and the input terminals of amplifiers 67a, 67b, 67c, and 67d to establish equal, preselected signal levels at each of the amplifiers 67a, 67b, 67c, and 67d. Amplifier 67 provides four amplified signals $\frac{1}{2}AS_{in}$, $\frac{1}{2}AS_{in}e^{j90}$, $\frac{1}{2}AS_{in}e^{j90}$, and $\frac{1}{2}AS_{in}e^{j180}$ which are respectively coupled to the input terminals 65b1, 65b2, 65c1 and 65c2 of three quadrature hybrids 69a, 69b, and 69c. A is the amplification of the amplifiers relative to the signal levels at the terminals 65b1, 65b2, 65c1, and 65c2. The quadrature hybrids 69a, 69b, and 69c are included in signal combiner 69. It should be recognized that hybrids 69b and 69c respectively couple signals $(1/\sqrt{2})AS_{in}e^{j90}$ and $(1/\sqrt{2})AS_{in}e^{j180}$ to the input terminals of hybrid 69a, which in tern provides the signal $AS_{in}e^{j180}$ to the combiner 45 via circulator 71.

Circulators 53, 55, 59, and 71 in FIG. 7 and circulators 15 and 19 in FIG. 1 provide isolation between elements by substantially diverting signal reflections from an element coupled to the output terminal of the circulator to a matched load coupled to the circulator, thus substantially preventing the incidence of the reflections to the element coupled to the input terminal of the circulator. This reflection elimination prevents improper loading of an element and substantially reduces the VSWR of the system.

While the invention has been described in its preferred embodiments, it is to understood that the words that have been used are words of description rather than limitation and that changes may be made within the purview of the appended claims without departing from the true scope and spirit of the invention in its broader aspects.

We claim:

1. A power amplifier of the type having a multiplicity of amplifying stages comprising:
    a first stage amplifier having means for receiving signals for amplification, a preselected amplification, and a first stage frequency response which provides an output signal with an amplitude that varies with frequency;
    an amplitude compensator coupled to said first stage and constructed and arranged to have an inverse frequency response to that of said first stage frequency response so that said amplitude compensator and said first stage in combination have a frequency response which provides signal amplitudes at an output terminal of said amplitude compensator that are substantially equal over a predetermined frequency band; and
    a second stage amplifier including
        a power divider having an input terminal coupled to said output terminal of said amplitude compensator and a plurality of output terminals;
        a plurality of high power amplifiers having input terminals respectively coupled to said output terminals of said power divider and output terminals each high-power amplifier including
            input means for coupling said high-power amplifier to said power divider;
            a phase shifter coupled to said input means, said phase shifter adjustable for equalizing signal phase at each high-power amplifier;
            a pre-amplifier coupled to said phase shifter, said pre-amplifier having an input signal attenuator for equalizing input signal amplitudes at each high-power amplifiers;
            a signal divider having an input terminal coupled to receive signals from said pre-amplifier and having a plurality of output terminals;

a plurality of signal amplifiers respectively coupled to receive signals from said signal divider, each signal amplifier having means for adjusting received signals to establish signals having equal amplitudes at input terminals of said signal amplifiers, each signal amplifier having an output terminal at which amplified adjusted signals are provided;

a signal combiner having a plurality of input terminals respectively coupled to said plurality of signal amplifiers, said signal combiner having an output terminal, coupled to said combiner, whereat a sum of said amplified adjusted signals are provided; and a combiner having a plurality of input terminals respectively coupled to said output terminals of said high power amplifiers and an output terminal for said second stage amplifier.

2. A power amplifier in accordance with claim 1 further including means for controlling saturation of said second stage amplifier.

3. A power amplifier in accordance with claim 1 wherein said first stage includes:

first and second switches respectively coupled to said receiving means and said amplitude compensator; and first and second amplifiers coupled between said first and second switches in a manner to couple said first amplifier between said receiving means and said amplitude compensator when said first and second switches are in a first switch position and to couple said second amplifier between said receiving means and said amplitude compensator when said first and second switches are in a second switch position.

4. A power amplifier in accordance with claim 3 wherein said first amplifier includes a failure detector which causes said first and second switches to switch from said first switch position to said second switch position when a failure is detected in said second amplifier.

5. A power amplifier in accordance with claim 3 further including means for balancing said first and second amplifiers.

6. A power amplifier in accordance with claim 1 wherein said power divider includes;

a radial transmission line;

an input terminal coupled to and centrally positioned with said radial transmission line; and a plurality of output terminals coupled to and circumferentially positioned about said radial transmission line.

7. A power amplifier in accordance with claim 1 wherein said combiner includes;

a radial transmission line;

an output terminal coupled to and centrally positioned with said radial transmission line; and a plurality of input terminals coupled to and circumferentially positioned about said radial transmission line.

8. A power amplifier in accordance with claim 1 wherein said amplitude compensator includes:

a first hybrid circuit having first and second output terminals and an input terminal coupled to receive said output signal of said first stage amplifier;

a second hybrid circuit having first and second input terminals and an output terminal coupled to said input terminal of said second stage amplifier; a first transmission line coupled between said first output terminal of said first hybrid circuit and said first input terminal of said second hybrid circuit; and a second transmission line, shorter than said first transmission line, coupled between said second output terminal of said first hybrid circuit and said second input terminal of said second hybrid circuit.

9. A power amplifier in accordance with claim 1 wherein said first and second stage amplifiers has a phase pushing factor that is less than 5.0°/volt and a voltage pushing factor that is less than 0.5 dB/volt.

10. A power amplifier in accordance with claim 9 wherein said first and second stage amplifiers are supplied with $V_{cc}$ voltages having ripple voltages that are less than three milli-volts.

* * * * *